United States Patent
Miyahara

(10) Patent No.: US 8,242,373 B2
(45) Date of Patent: Aug. 14, 2012

(54) FLEXIBLE WIRING BOARD WITH CHARACTERISTIC IMPEDANCE CONTROL CIRCUIT

(75) Inventor: Seiichiro Miyahara, Ibaraki-Ken (JP)

(73) Assignee: Nippon Mektron, Ltd., Tokyo-To (JP)

( * ) Notice: Subject to any disclaimer, the term of this patent is extended or adjusted under 35 U.S.C. 154(b) by 798 days.

(21) Appl. No.: 12/227,365

(22) PCT Filed: Jun. 6, 2007

(86) PCT No.: PCT/JP2007/061426
§ 371 (c)(1),
(2), (4) Date: Nov. 14, 2008

(87) PCT Pub. No.: WO2008/026359
PCT Pub. Date: Mar. 6, 2008

(65) Prior Publication Data
US 2009/0236126 A1    Sep. 24, 2009

(30) Foreign Application Priority Data

Aug. 29, 2006  (JP) .................................. 2006-231801

(51) Int. Cl.
*H05K 1/00* (2006.01)
(52) U.S. Cl. ......................................................... 174/254
(58) Field of Classification Search .................... 174/254
See application file for complete search history.

(56) References Cited

U.S. PATENT DOCUMENTS

| | | | | |
|---|---|---|---|---|
| 3,876,964 A | * | 4/1975 | Balaster et al. | 333/238 |
| 5,262,590 A | * | 11/1993 | Lia | 174/36 |
| 6,483,713 B2 | * | 11/2002 | Samant et al. | 361/749 |
| 6,885,549 B2 | * | 4/2005 | Thomason | 361/679.27 |
| 6,927,343 B2 | * | 8/2005 | Watanabe et al. | 174/254 |
| 7,145,411 B1 | * | 12/2006 | Blair et al. | 333/5 |
| 8,071,885 B2 | * | 12/2011 | Honjo et al. | 174/254 |
| 2001/0010271 A1 | * | 8/2001 | Lin et al. | 174/255 |
| 2002/0189854 A1 | * | 12/2002 | Crumly | 174/254 |
| 2005/0018409 A1 | * | 1/2005 | Hirakata | 361/752 |
| 2005/0242960 A1 | * | 11/2005 | Tikov et al. | 340/572.7 |
| 2006/0172588 A1 | * | 8/2006 | Peng | 439/492 |
| 2007/0000126 A1 | * | 1/2007 | Na | 29/829 |

FOREIGN PATENT DOCUMENTS

| | | |
|---|---|---|
| JP | 1989/86261 | 6/1989 |
| JP | 03-101184 | 4/1991 |
| JP | 08-213722 | 8/1996 |
| JP | 2002204042 A * | 7/2002 |
| JP | 2004-363535 | 12/2004 |
| JP | 2006-173310 | 6/2006 |

OTHER PUBLICATIONS

Lydegraf et al., Method of Constructing a Controlled Impedence Flat Flexible Cable with Ground Shield, Jan. 2001, Research Disclosure, Jan. 2001 Journal, RD Database No. 221063.*
International Search Report dated Jul. 17, 2007.

* cited by examiner

*Primary Examiner* — Timothy Thompson
*Assistant Examiner* — Nathan Milakovich
(74) *Attorney, Agent, or Firm* — Jacobson Holman PLLC

(57) ABSTRACT

A flexible wiring board is provided having a wiring structure which can reduce transmission loss by reducing impedance mismatching even if being folded in a three-dimensional manner. In a flexible wiring board 10 having a characteristic impedance control circuit 20, the flexible wiring board has a planar projection shape of a folded spot 20A in the characteristic impedance control circuit after folding in an arc state along a tangent.

4 Claims, 4 Drawing Sheets

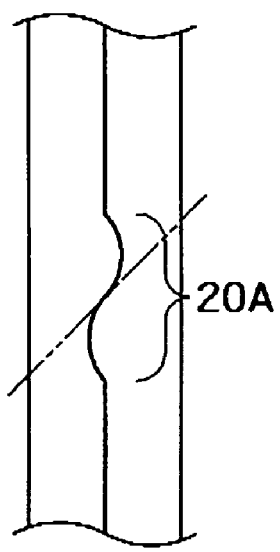
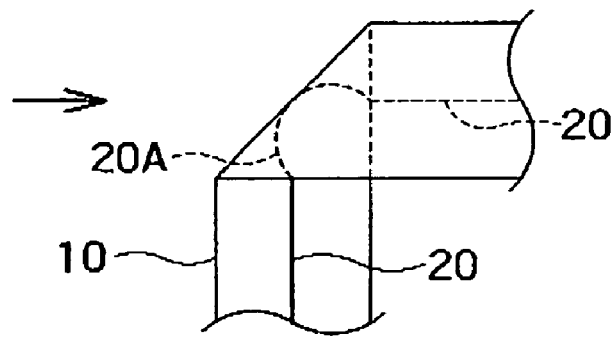
FIG. 1A    FIG. 1B
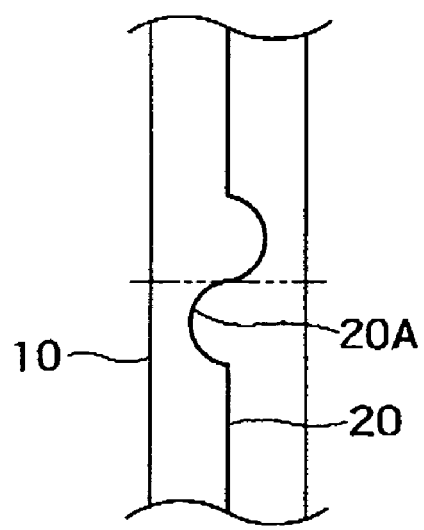
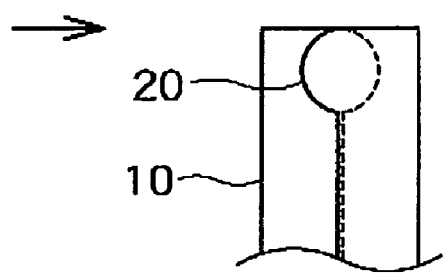
FIG. 2A    FIG. 2B

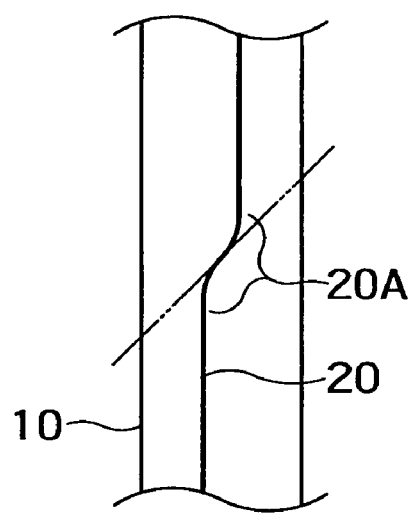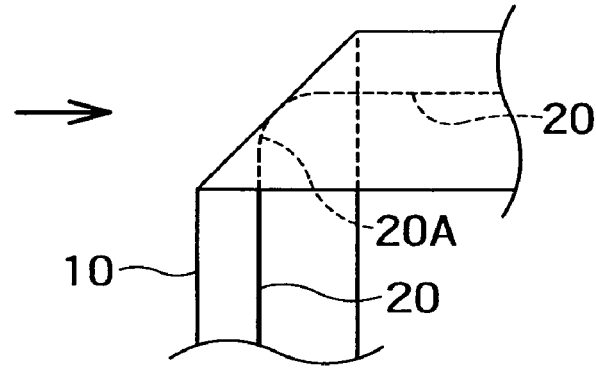
FIG. 3A          FIG. 3B
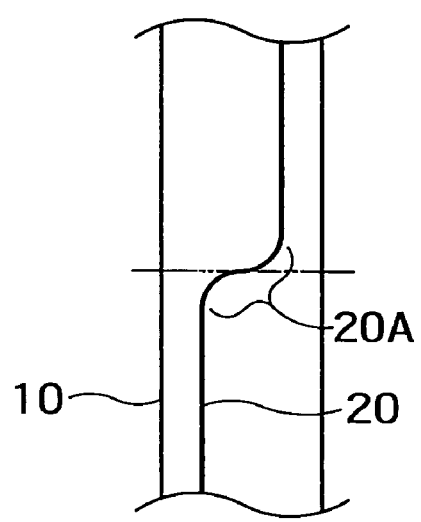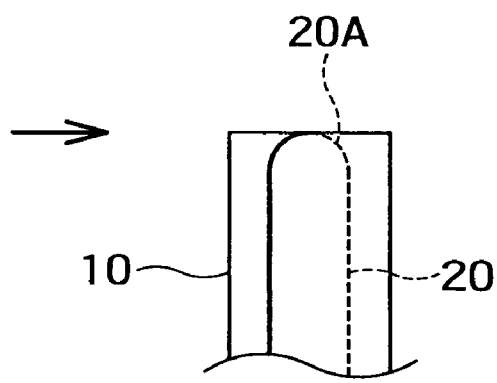
FIG. 4A          FIG. 4B

FLEXIBLE WIRING BOARD WITH CHARACTERISTIC IMPEDANCE CONTROL CIRCUIT

This is a national stage of PCT/JP07/061426 filed Jun. 6, 2007 and published in Japanese, which has a priority of Japan no. 2006-231801 filed Aug. 29, 2006, hereby incorporated by reference.

BACKGROUND OF THE INVENTION

1. Field of the Invention

The present invention relates to a flexible wiring board and particularly to a characteristic impedance control circuit for a high-frequency signal.

2. Related Art

A flexible wiring board 10 has been incorporated in a small-sized electronic device as shown in FIG. 7 in many cases, and particularly a cable portion is folded along a folding line shown by a broken line and incorporated in equipment. In this case, an impedance control line 20 is sharply folded at a portion of the folding line and the characteristic impedance is rapidly changed at this folded portion.

That is, in the characteristic impedance control circuit of a high-frequency circuit formed on a flexible wiring board, electromagnetic-field distribution is distorted at a folded portion in the circuit ("microstrip line" in Patent Document 1), which might adversely affect circuit characteristics such as reflection and irradiation or malfunction of other circuits as described in [Background Art] in Patent Document 1.

As a measure against that, it is possible to form the folded portion in a characteristic impedance control circuit as long as it is on a plane (Patent Document 1).

However, when three-dimensional folding is to be performed at an assembling stage of the flexible wiring board into electronic equipments, the change will be made at a steep angle in the state where the characteristic impedance control circuit is folded as in Patent Document 1.

As a result, the electromagnetic-field distribution is distorted and signal reflection or irradiation is generated, which might cause adverse effect of the circuit characteristic or malfunction of other circuits.

Patent Document 1: Japanese Patent Laid-Open No. 2004-363535

SUMMARY OF THE INVENTION

The characteristic impedance control circuit in a high-frequency circuit shows the best transmission characteristic in a straight and uniform state as above.

However, in an actual product having a high-frequency circuit, in the case of a flexible wiring board, not only folding on a plane but three-dimensional folding spots are also generated.

The present invention was made in view of the above points and has an object to provide a flexible wiring board having a wiring structure which can reduce transmission loss by reducing impedance mismatching even in the case of three-dimensional folding.

In order to achieve the above object, the present invention provides a flexible wiring board, characterized in that in a fixable wiring board having a characteristic impedance control circuit, a planar projection shape of a folded spot in said characteristic impedance control circuit after folding is an arc state along a tangent.

Since the present invention is configured so that the planar projection shape of a folded spot in a characteristic impedance control circuit after folding draws an arc along a tangent, local impedance mismatching in the characteristic impedance control circuit can be reduced.

BRIEF DESCRIPTION OF THE DRAWINGS

FIGS. 1A and 1B are explanatory diagrams illustrating a configuration of a first embodiment of the present invention, in which FIGS. 1A and 1B show each state before and after folding;

FIGS. 2A and 2B are explanatory diagrams illustrating a configuration of a second embodiment of the present invention, in which FIGS. 2A and 2B show each state before and after folding;

FIGS. 3A and 3B are explanatory diagrams illustrating a configuration of a third embodiment of the present invention, in which FIGS. 3A and 3B show each state before and after folding;

FIGS. 4A and 4B are explanatory diagrams illustrating a configuration of a fourth embodiment of the present invention, in which FIGS. 4A and 4B show each state before and after folding;

FIGS. 5A and 5B are explanatory diagrams illustrating a configuration of a fifth embodiment of the present invention, in which FIGS. 5A and 5B show each state before and after folding;

DETAILED DESCRIPTION OF THE INVENTION

Figure 5A:
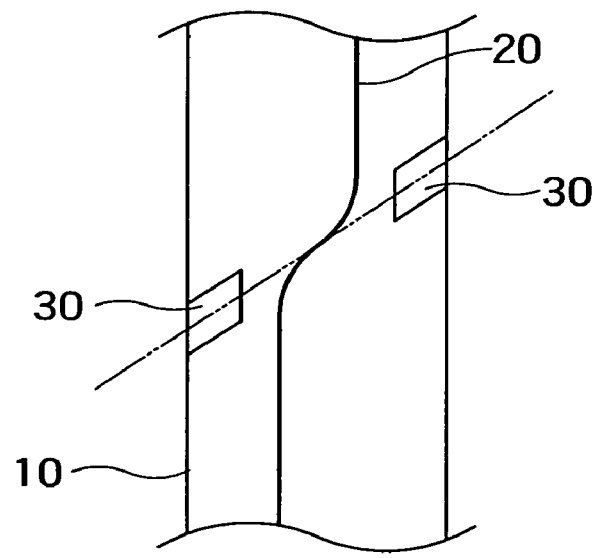

Embodiments of the present invention will be described below referring to the attached drawings.

Embodiment 1

FIGS. 1A and 1B illustrate a first embodiment of the present invention, in which FIG. 1A shows a state before folding and FIG. 1B shows a state after folding.

In FIGS. 1A and 1B, a flexible wiring board 10 has a characteristic impedance control circuit, that is, an impedance control line 20 having a folded portion 20A extending in a straight state along the substantial center in its width direction and having a planar shape before folding in the S-shape at the substantial center in the longitudinal direction.

As shown in FIG. 1A, in the S-shaped portion constituting the folded portion 20A, its center portion includes a portion parallel to a folding line (shown by an imaginary line) set in the direction diagonal to the flexible wiring board 10 and also crossing it.

As a result, as shown in FIG. 1B, when the flexible wiring board 10 is folded along the folding line, the planar projection mage of the folded portion 20A is in relation to make an arc shape with the folding line as a tangent.

Therefore, the entire planar projection image of the impedance control line 20 after the flexible wiring board 10 is folded is configured so that a portion tangent to the folding line is in an arc state and the ends of the impedance control line 20 arranged in the relation crossing each other are connected at the arc-state portion.

Here, a connected portion between the straight portion and the arc-state portion of the impedance control line 20 is folded as smoothly as possible. For that purpose, such a measure may be taken that the position of the impedance control line 20 is brought close to one side in the width direction of the flexible wiring board 10, the size of an arc of the folded portion 20A is set appropriately or a curvature of the arc is varied continuously.

That is, the arc state refers to a shape including a literal circle having a single curvature and also a case where circles with different curvatures are sequentially continued. Since the arc continues to the straight portion, it is needless to say that the connection portion has a curvature different from that of the arc.

When the straight portions of the impedance control line are arranged at a right angle by folding the flexible board 10 along the folding line in this way, since the straight portions are connected by the arc-state portion, a smooth planar shape is obtained without making a sharp bending in its entirety.

Since the flexible wiring board 10 is folded along the folding line and overlapped, it is actually folded also in the thickness direction, and the folded portion 20A is folded in a three-dimensional manner. However, the folding in the thickness direction is slight, which can be ignored in practice.

Thus, the impedance control line 20 is configured in a folded shape hardly affecting the entire characteristic impedance including the folded portion 20A.

Embodiment 2

FIGS. 2A and 2B show a second embodiment of the present invention and an example in which the folding line crosses the flexible wiring board 10 in the width direction so that the flexible wiring board 10 is folded in the longitudinal direction. Here, the folded portion 20A is configured as the S-shape formed by continuing substantial semi-circles in opposite directions so that a planar projection shape substantially becomes a circle (See FIG. 2B) after folding as shown in FIG. 1A.

In this case, too, it is configured so that a connection portion between the folded portion 20A and the straight portion of the impedance control line 20 is folded smoothly. For that purpose, the position of the straight portion may be displaced to one side in the width direction of the flexible wiring board 10.

Embodiment 3

FIGS. 3A and 3B show a third embodiment of the present invention, in which the S-shape of the folded portion 20A is made small and the straight portions on both sides of the folded portion 20A are displaced to one side in the width direction of the flexible wiring board 10 (FIG. 3A).

By this configuration, referring to the state after folding shown in FIG. 3B, as shown in FIG. 3B, the straight portions crossing each other are connected by a substantial ¼ arc.

Thus, the impedance control line 20 configures a planar projection shape including only one folding portion, including the folded portion 20A.

Embodiment 4

FIGS. 4A and 4B show a fourth embodiment of the present invention, in which the S-shape of the folded portion 20A is made small and the folding line is set so as to cross the width direction of the flexible wiring board 10 at a right angle as in the second embodiment. Here, the folded portion 20A makes a semi circle connecting two straight portions arranged in parallel.

Embodiment 5

Figure 5B:
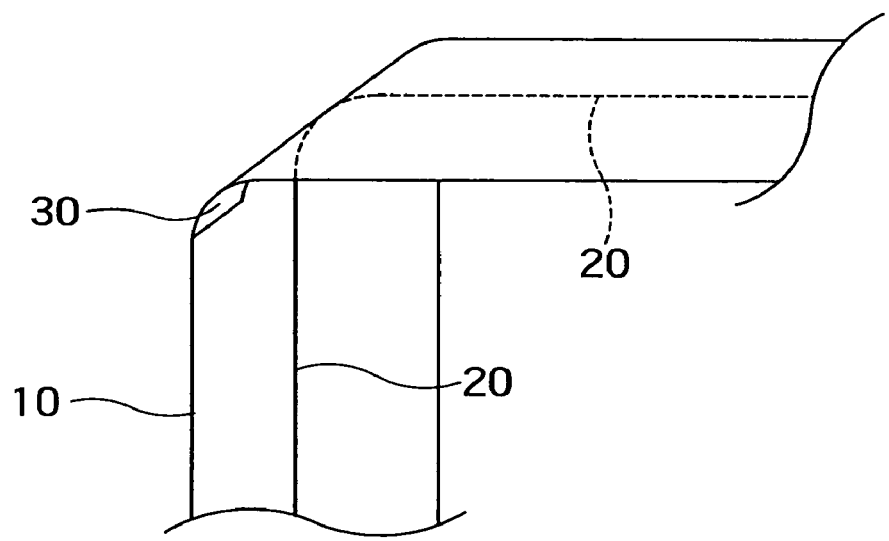

FIGS. 5A and 5B show a fifth embodiment of the present invention, in which in order to fold the impedance control line 20 in a three-dimensional manner, a reinforcing member 30 is provided inside the folded portion of the flexible wiring board 10 so as to realize gentle folding.

By this configuration, the folding degree of the impedance control line 20 becomes gentle, and local stress concentration to the flexible wiring board 10 and the impedance control line 20 can be prevented.

Embodiment 6

Figure 6:
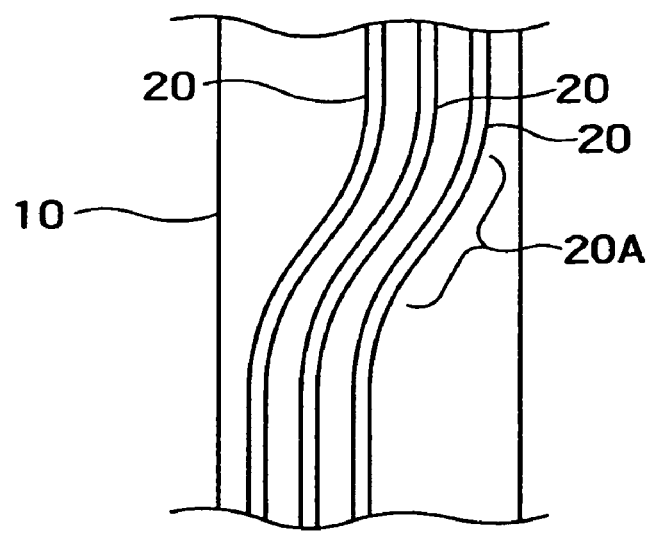
FIG. 6 is an explanatory diagram illustrating a sixth embodiment of the present invention.
Figure 7:
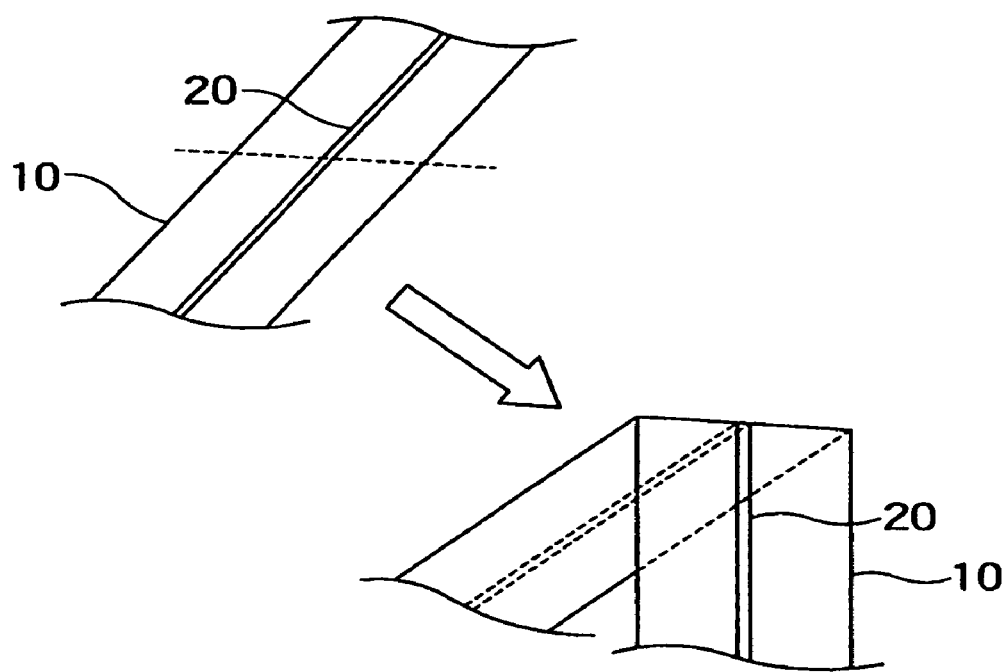
FIG. 7 is an explanatory diagram illustrating a characteristic impedance control circuit of a conventional flexible wiring board.

FIGS. 6A and 6B show a sixth embodiment of the present invention and a configuration of the folded portion 20A when a plurality of impedance control lines 20 are arranged in parallel.

By this configuration, even if the plurality of impedance control lines 20 are provided on a single flexible wiring board 10, the characteristic impedance of each impedance control line 20 is hardly affected.

What is claimed is:

1. A flexible wiring board having a characteristic impedance control circuit, comprising
   a planar projection shape of a folded portion in said characteristic impedance control circuit after folding being an arc shape along a tangent of said arc shape,
   wherein the folding is completed along the tangent.
2. The flexible wiring board according to claim 1, wherein a planar shape of said folded portion before the folding is substantially in an S-shape.
3. The flexible wiring board according to claim 1, wherein a reinforcing member or a reinforcing pattern is formed at a side end of a scheduled folded portion in the flexible wiring board so that the characteristic impedance control circuit at the folded portion is not wrinkled by the folding.
4. The flexible wiring board according to claim 1, wherein said folded portion in said characteristic impedance control circuit overlaps with itself.

* * * * *